(12) United States Patent  
Jung et al.

(10) Patent No.: US 7,820,546 B2
(45) Date of Patent: Oct. 26, 2010

(54) METHOD FOR MANUFACTURING SEMICONDUCTOR DEVICE PREVENTING LOSS OF JUNCTION REGION

(75) Inventors: Dong Ha Jung, Gyeonggi-do (KR); Seung Jin Yeom, Gyeonggi-do (KR); Baek Mann Kim, Gyeonggi-do (KR); Chang Soo Park, Seoul (KR); Jeong Tae Kim, Gyeonggi-do (KR); Nam Yeal Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 121 days.

(21) Appl. No.: 12/347,420

(22) Filed: Dec. 31, 2008

(65) Prior Publication Data

US 2009/0269915 A1 Oct. 29, 2009

(30) Foreign Application Priority Data

Apr. 28, 2008 (KR) .................. 10-2008-0039509

(51) Int. Cl.
*H01L 21/4763* (2006.01)
(52) U.S. Cl. ................ 438/630; 438/664; 257/E21.622
(58) Field of Classification Search .......... 257/E21.622, 257/E21.293; 438/755, 664, 655, 630, 649, 438/581
See application file for complete search history.

(56) References Cited

U.S. PATENT DOCUMENTS

| 7,605,077 | B2* | 10/2009 | Henson et al. | 438/649 |
| 2008/0048274 | A1* | 2/2008 | Seo et al. | 257/411 |
| 2009/0108382 | A1* | 4/2009 | Eriksen et al. | 257/419 |
| 2009/0136765 | A1* | 5/2009 | Maschwitz et al. | 428/432 |
| 2009/0317972 | A1* | 12/2009 | Anderson et al. | 438/630 |

FOREIGN PATENT DOCUMENTS

KR 1998-0079138 B1 11/1998

* cited by examiner

*Primary Examiner*—Thao P. Le
(74) *Attorney, Agent, or Firm*—Ladas & Parry LLP

(57) ABSTRACT

A method for manufacturing a semiconductor device includes forming an insulation layer having a contact hole on a semiconductor substrate. A metal silicide layer is deposited on a surface of the contact hole and the insulation layer to have a concentration gradient that changes from a silicon-rich composition to a metal-rich composition, with the lower portion of the metal silicide layer having the silicon-rich composition and the upper portion of the metal silicide layer having the metal-rich composition. The metal silicide layer is then annealed so that the compositions of metal and silicon in the metal silicide layer become uniform.

20 Claims, 4 Drawing Sheets

METHOD FOR MANUFACTURING SEMICONDUCTOR DEVICE PREVENTING LOSS OF JUNCTION REGION

CROSS-REFERENCE TO RELATED APPLICATIONS

The present application claims priority to Korean patent application number 10-2008-0039509 filed on Apr. 28, 2008, which is incorporated herein by reference in its entirety.

BACKGROUND OF THE INVENTION

The present invention relates generally to a method for manufacturing a semiconductor device, and more particularly, to a method for manufacturing a semiconductor device in which a $CoSi_2$ layer can be formed without the loss of the junction region.

In a highly integrated semiconductor device, it is essential to secure stable contact between upper and lower patterns. The reason for this resides in that, even with finely formed patterns, if stable contact between the upper and lower patterns is not secured, the reliability of the semiconductor device can deteriorate and high speed drivability thereof cannot be accomplished.

Meanwhile, in a highly integrated semiconductor device the size of a contact must be decreased. This decrease in the contact size results in an increase in contact resistance. In order to compensate for the decrease in the size of a contact and to decrease contact resistance, studies have been conducted regarding the suitability of a $TiSi_2$ layer formed at a region where upper and lower patterns contact each other.

However, when the $TiSi_2$ layer is formed in a contact hole, and when the size of a contact hole is decreased, contact resistance is increased. As a result, studies are being conducted on the suitability of the use of a $CoSi_2$ layer for decreasing contact resistance rather than using the $TiSi_2$ layer.

A conventional method for forming a $CoSi_2$ layer will be briefly described below.

An insulation layer is formed on a semiconductor substrate having transistors. The insulation layer is etched to define a contact hole that exposes the junction region of the semiconductor substrate. A Co layer is deposited on the insulation layer and the surface of the contact hole. An annealing process is then conducted on the semiconductor substrate having the Co layer, and thereby, a CoSix layer is formed on the portion of the semiconductor substrate at the bottom of the contact hole (that is, on the surface of the junction region). Thereafter, a portion of the Co layer, which did not react when forming the CoSix layer, is removed. Then, a $CoSi_2$ layer is formed by annealing the CoSix layer.

However, the conventional method for forming a $CoSi_2$ layer described above causes a loss of a portion of the semiconductor substrate on which the $CoSi_2$ layer is formed (that is, the junction region). This causes the leakage current characteristics of the semiconductor device to degrade, which can be very problematic.

In more detail, the CoSix layer is formed through process steps including depositing and annealing the Co layer. At this time, the thickness of the $CoSi_2$ layer, which is formed by the reaction of Co and Si, becomes 3.35 times greater than the deposition thickness of the Co layer. In this regard, it is conceivable that a substantial portion of the junction region of the semiconductor substrate reacts with the Co layer. Hence, since the thickness of the junction region of the semiconductor substrate (that is, the size of the junction region) decreases by the thickness of the junction region that reacts with the Co layer, the leakage current characteristics of the semiconductor device degrade and the electrical characteristics of the semiconductor device are adversely influenced, whereby operation errors can be caused in the semiconductor device.

Moreover, the Co layer is deposited through chemical vapor deposition (CVD), and while the Co layer is being deposited, (in this case, the composition of the entire Co layer is uniform), reaction is likely to occur between the semiconductor substrate and the deposited Co layer in the course of depositing the Co layer. Consequently, as the size of the junction region decreases, the above-described problems are caused. In particular, in the conventional art, it is difficult to secure a process margin in terms of reproducibility.

SUMMARY OF THE INVENTION

Embodiments of the present invention are directed to a method for manufacturing a semiconductor device in which a $CoSi_2$ layer can be formed without the loss of the junction region.

In one aspect of the present invention, a method for manufacturing a semiconductor device includes the steps of forming an insulation layer having a contact hole on a semiconductor substrate; depositing a metal silicide layer on a surface of the contact hole and the insulation layer to have a concentration gradient that changes from a silicon-rich composition (of a lower portion of the metal silicide layer) to a metal-rich composition (of an upper portion of the metal silicide layer); and annealing the metal silicide layer such that compositions of metal and silicon in the metal silicide layer become uniform.

After the step of forming the insulation layer having the contact hole and before the step of depositing the metal silicide layer, the method may also include the step of cleaning the resultant semiconductor substrate including a bottom of the contact hole.

The metal silicide layer can be deposited through a CVD process.

The metal silicide layer may be deposited as a $CoSi_x$ layer.

The metal and the silicon of the $CoSi_x$ layer have a composition ratio in the range of 1:3~1:10 in the silicon-rich portion of the metal silicide layer.

The metal and the silicon of the $CoSi_x$ layer have a composition ratio in the range of 1:0.1~1:0.9 in a metal-rich portion of the metal silicide layer.

After the step of depositing the metal silicide layer and before the step of annealing the metal silicide layer, the method may further comprise the step of depositing a capping payer on the metal silicide layer.

The step of depositing the capping layer can be implemented in situ with respect to the step of depositing the metal silicide layer.

The capping layer may be deposited as a Ti layer or a TiN layer.

Annealing of the metal silicide layer is conducted at a temperature in the range of 700~850° C.

In another aspect, a method for manufacturing a semiconductor device includes the steps of forming a gate and a junction region on a semiconductor substrate; forming an insulation layer on the semiconductor substrate; defining a contact hole by etching the insulation layer to expose the junction region; depositing a metal silicide layer on a surface of the contact hole and the insulation layer to have a concentration gradient that changes from a silicon-rich composition (of a lower portion of the metal silicide layer) to a metal-rich composition (of an upper portion of the metal silicide layer);

and annealing the metal silicide layer such that compositions of metal and silicon in the metal silicide layer become uniform.

After the step of forming the insulation layer having the contact hole and before the step of depositing the metal silicide layer, the method may further comprise the step of cleaning the resultant semiconductor substrate including a bottom of the contact hole.

The metal silicide layer can be deposited through a CVD process.

The metal silicide layer may be deposited as a $CoSi_x$ layer.

The metal and the silicon of the $CoSi_x$ layer have a composition ratio in the range of 1:3~1:10 in a silicon-rich portion of the metal silicide layer.

The metal and the silicon of the $CoSi_x$ layer have a composition ratio in the range of 1:0.1~1:0.9 in a metal-rich portion of the metal silicide layer.

After the step of depositing the metal silicide layer and before the step of annealing the metal silicide layer, the method may further comprise the step of depositing a capping payer on the metal silicide layer.

The step of depositing the capping layer can be implemented in situ with respect to the step of depositing the metal silicide layer.

The capping layer may be deposited as a Ti layer or a TiN layer.

Annealing of the metal silicide layer is conducted at a temperature in the range of 700~850° C.

DESCRIPTION OF SPECIFIC EMBODIMENTS

Hereafter, the specific embodiments of the present invention will be described in detail with reference to the accompanying drawings.

Figure 1A:
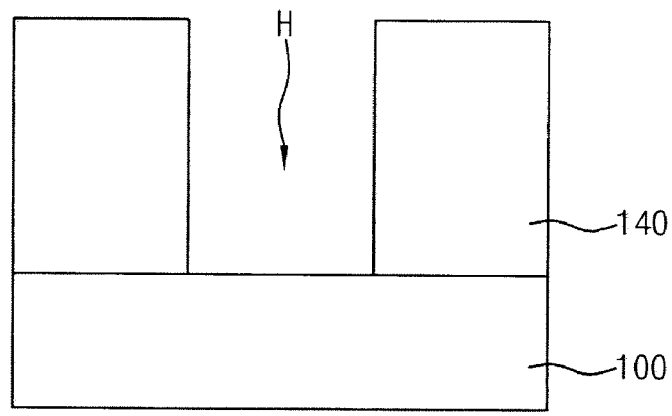
FIGS. 1A through 1C are cross-sectional views shown for illustrating the processes of a method for manufacturing a semiconductor device in accordance with an embodiment of the present invention.
Figure 1B:
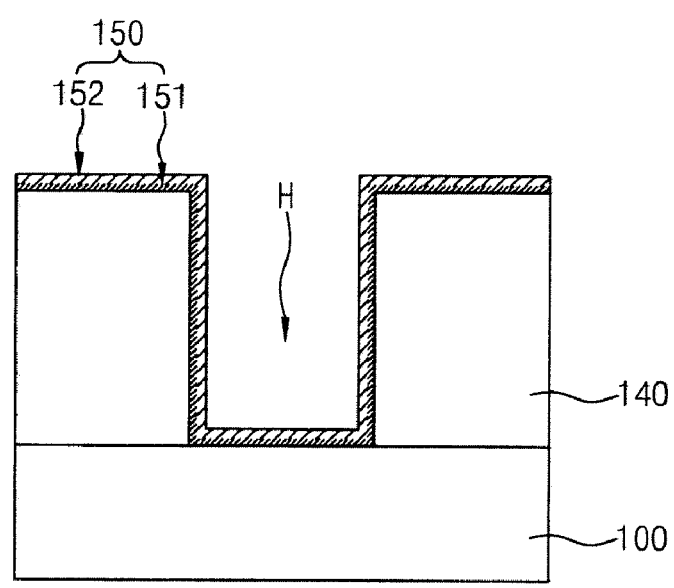
Figure 1C:
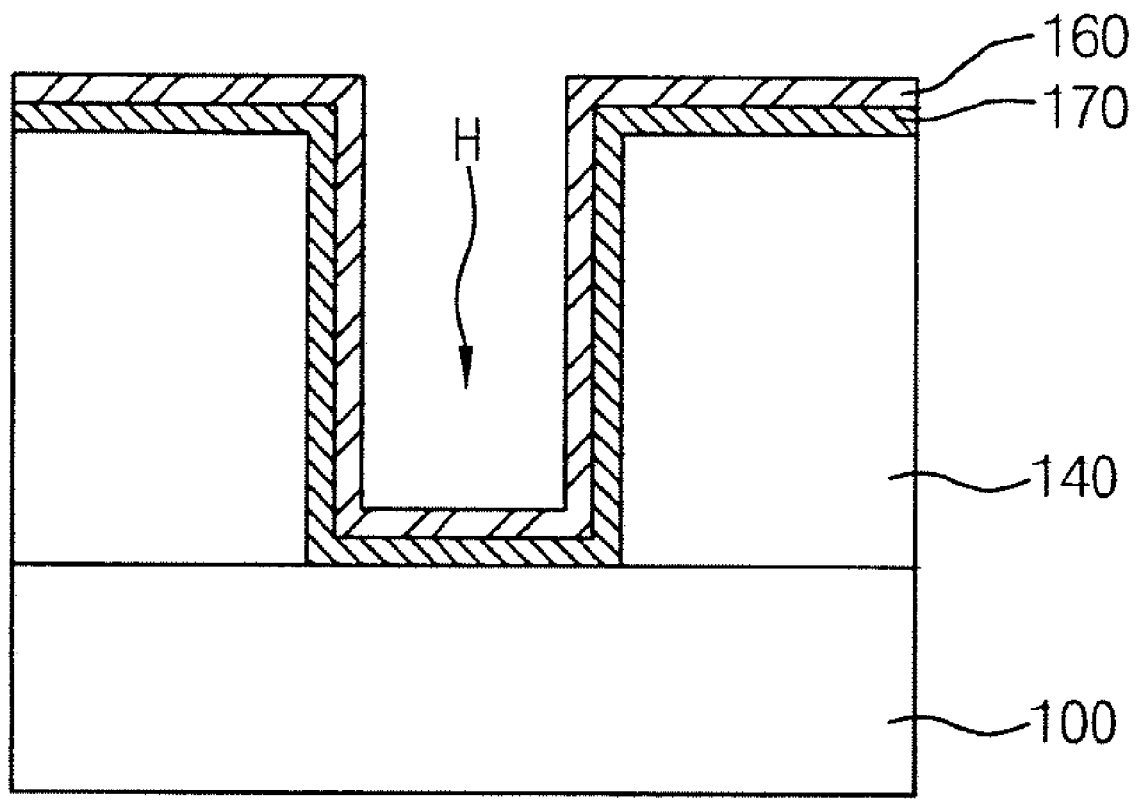

FIGS. 1A through 1C are cross-sectional views shown for illustrating the processes of a method for manufacturing a semiconductor device in accordance with an embodiment of the present invention.

Referring to FIG. 1A, an insulation layer 140 is formed on a semiconductor substrate 100. The insulation layer 140 is etched to define a contact hole H that exposes a portion of the semiconductor substrate 100. In order to remove a native oxide layer produced when etching the insulation layer 140, a cleaning process is conducted on the resultant semiconductor substrate 100 including the bottom surface of the contact hole H.

Referring to FIG. 1B, a metal silicide layer 150, preferably a CoSix layer 150, is deposited on the surface of the contact hole H (including the exposed portion of the semiconductor substrate 100) and on the insulation layer 140 through a CVD process. At this time, the CoSix layer 150 is deposited to have a concentration gradient in which the CoSix layer 150 gradually changes from a silicon-rich layer to a cobalt-rich layer.

In detail, the CoSix layer 150 is deposited through a CVD process using a cobalt-containing gas and a silicon-containing gas. In an initial deposition stage, the flow rate of the silicon-containing gas is increased, such that a lower portion 151 of the CoSix layer 150, which contacts the semiconductor substrate 100 and the insulation layer 140, can be deposited as a silicon-rich layer containing a substantial amount of silicon. Then, the flow rate of the silicon-containing gas is gradually decreased and the flow rate of the cobalt-containing gas is gradually increased, such that an upper portion 152 of the CoSix layer 150 can be deposited as a cobalt-rich layer containing a substantial amount of cobalt.

For example, in the lower portion 151 of the CoSix layer 150, which has a silicon-rich composition, cobalt and silicon have a composition ratio in the range of 1:3~1:10 cobalt to silicon, and in the upper portion 152 of the CoSix layer 150, which has a cobalt-rich composition, cobalt and silicon has a composition ratio in the range of 1:0.1~1:0.9 cobalt to silicon.

Referring to FIG. 1C, a capping layer 160 is deposited on the CoSix layer 150. The capping layer 160 is deposited as a Ti layer or a TiN layer. A deposition process for depositing the capping layer 160 is conducted in situ with respect to the deposition process of the CoSix layer 150. The resultant semiconductor substrate 100 having the capping layer 160 is then annealed at a temperature in the range of 700~850° C., and through this annealing, a $CoSi_2$ layer 170, which has balanced compositions of cobalt and silicon, is finally formed. That is, in the $CoSi_2$ layer 170, cobalt and silicon are diffused into portions of the layer having insufficient compositions by virtue of the annealing so as to satisfy the stoichiometric ratio of the $CoSi_2$ layer 170.

Thereafter, while not shown in the drawings, by sequentially conducting a series of well-known subsequent processes, the manufacture of a semiconductor device according to an embodiment of the present invention is completed.

Meanwhile, the method for forming a $CoSi_2$ layer according to the above embodiment can be applied to a junction region.

FIGS. 2A through 2D are cross-sectional views shown for illustrating the processes of a method for manufacturing a semiconductor device in accordance with another embodiment of the present invention.

Figure 2A:
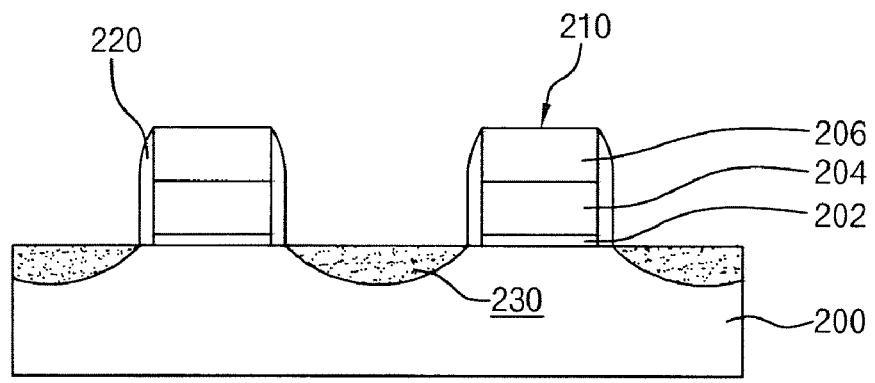
FIGS. 2A through 2D are cross-sectional views shown for illustrating the processes of a method for manufacturing a semiconductor device in accordance with another embodiment of the present invention.

Referring to FIG. 2A, one or more gates 210, each of which has a stack structure including a gate insulation layer 202, a gate conductive layer 204 and a hard mask layer 206, are formed on a semiconductor substrate 200. Spacers 220 are formed on both sidewalls of the gates 210, and then an ion implantation process is conducted on the semiconductor substrate 200 to form junction regions 230 in the semiconductor substrate 200 on both sides of the gates 210 having the spacers 220.

Figure 2B:
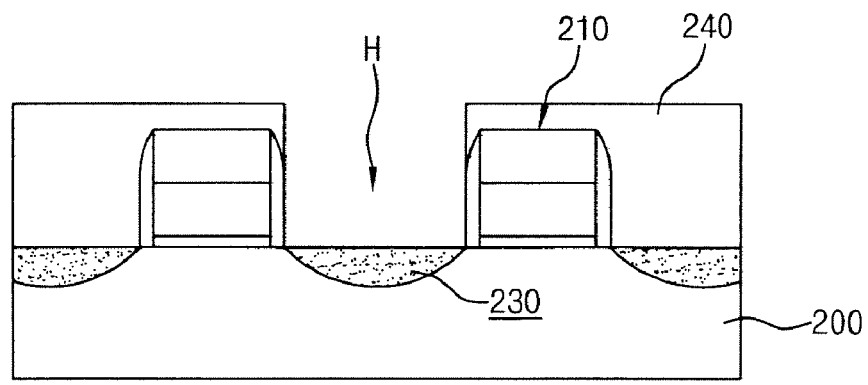

Referring to FIG. 2B, an insulation layer 240 is deposited on the semiconductor substrate 200 to cover the gates 210. The surface of the insulation layer 240 is then planarized through a chemical mechanical polishing (CMP) process. The insulation layer 240 is etched to define a contact hole H exposing the junction region 230 (more specifically, the junction region 230 on which a bit line contact is to be formed). In order to remove a native oxide layer produced on the surface of the junction region 230, a cleaning process is conducted on the resultant semiconductor substrate 200 including the bottom surface of the contact hole H.

Figure 2C:
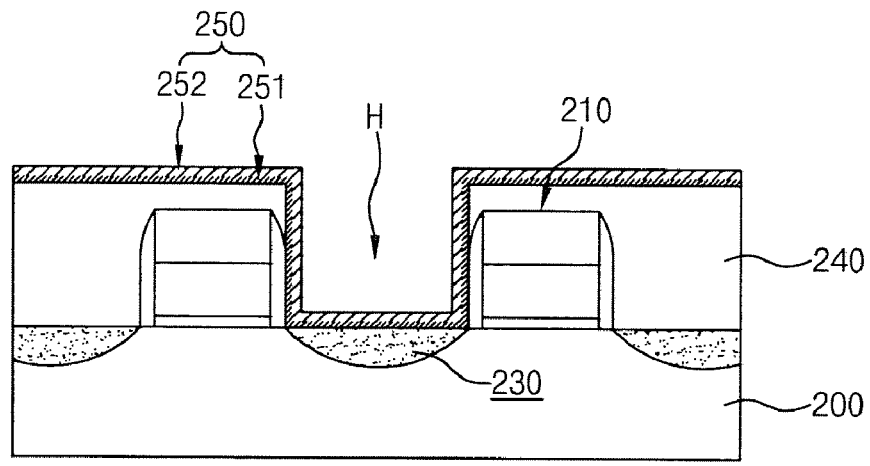

Referring to FIG. 2C, a metal silicide layer, and preferably a CoSix layer 250, is deposited on the surface of the contact hole H and on the insulation layer 240 through a CVD process using a cobalt-containing gas and a silicon-containing gas. At this time, the CoSix layer 250 is deposited to have a concentration gradient by adjusting the flow rates of the cobalt-containing gas and the silicon-containing gas. Preferably, the CoSix layer 250 is deposited to have a concentration gradient that changes from a silicon-rich composition to a cobalt-rich composition, with a lower portion 251 of the CoSix layer 250 contacting the surface of the contact hole H having the cobalt-rich composition and an upper portion 252 of the CoSix layer 250 having the cobalt-rich composition.

For example, in the lower portion 251 of the CoSix layer 250, which has a silicon-rich composition, cobalt and silicon have a composition ratio in the range of 1:3~1:10 cobalt to silicon, and in the upper portion 252 of the CoSix layer 250, which has a cobalt-rich composition, cobalt and silicon has a composition ratio in the range of 1:0.1~1:0.9 cobalt to silicon.

Figure 2D:
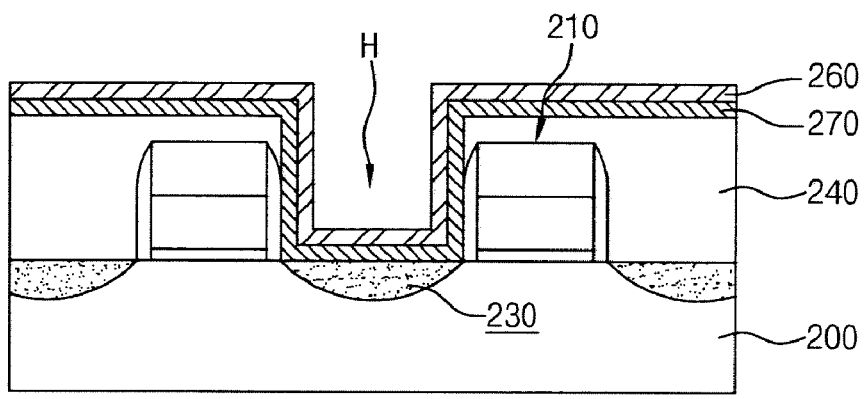

Referring to FIG. 2D, a capping layer 260 comprising a Ti layer or a TiN layer is deposited on the CoSix layer 250. A deposition process for depositing the capping layer 260 is conducted in situ with respect to the deposition process of the CoSix layer 250. The resultant semiconductor substrate 200 having the capping layer 260 is annealed at a temperature in the range of 700~850° C., and through this annealing, a $CoSi_2$ layer 270, which has balanced compositions of cobalt and silicon, is finally formed. The $CoSi_2$ layer 170 having balanced compositions of cobalt and silicon is formed because cobalt and silicon are diffused into portions having insufficient compositions by virtue of the annealing.

Thereafter, while not shown in the drawings, by sequentially conducting a series of well-known subsequent processes, the manufacture of a semiconductor device according to another embodiment of the present invention is completed.

As is apparent from the above description, in the present invention, after forming a CoSix layer such that the lower portion of the CoSix layer contacting a junction region is silicon-rich and the CoSix layer gradually becomes cobalt-rich as it extends in the upward direction, a $CoSi_2$ layer which satisfies a stoichiometric ratio can be finally formed by conducting an annealing process. According to this, in the present invention, it is possible to prevent the silicon of a semiconductor substrate from reacting with cobalt while conducting the annealing process.

Accordingly, since the present invention prevents the silicon of the semiconductor substrate from reacting with cobalt, loss of the semiconductor substrate (that is, the loss of a junction region) can be avoided. As a result, it is possible to prevent the size of the junction region from decreasing, the leakage current characteristics of a semiconductor device are prevented from degrading, and operation errors are not caused.

Further, in the present invention, because the final $CoSi_2$ layer is formed without depositing a cobalt layer, it is possible to avoid the unwanted reaction between a deposited cobalt layer and the silicon of the substrate in the course of depositing the cobalt layer. Therefore, the loss of the substrate (that is, the loss of the junction region) can be avoided, and a process margin can be secured in terms of reproducibility.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming an insulation layer having a contact hole on a semiconductor substrate;
    depositing a metal silicide layer on a surface of the contact hole and the insulation layer, the metal silicide having a concentration gradient that changes from a silicon-rich composition to a metal-rich composition, wherein a lower portion of the metal silicide layer has the silicon-rich composition and an upper portion of the metal silicide layer has the metal-rich composition; and
    annealing the metal silicide layer such that compositions of metal and silicon in the metal silicide layer become uniform.

2. The method according to claim 1, further comprising the step of:
    after forming the insulation layer having the contact hole and before depositing the metal silicide layer, cleaning the resultant semiconductor substrate including a bottom of the contact hole.

3. The method according to claim 1, wherein the metal silicide layer is deposited through a CVD process.

4. The method according to claim 1, wherein the metal silicide layer comprises a $CoSi_x$ layer.

5. The method according to claim 1, wherein the metal to silicon composition ratio is in the range of 1:3~1:10 in the silicon-rich portion of the metal silicide layer.

6. The method according to claim 1, wherein the metal to silicon composition ratio is in the range of 1:0.1~1:0.9 in the metal-rich portion of the metal silicide layer.

7. The method according to claim 1, further comprising the step of:
    after depositing the metal silicide layer and before annealing the metal silicide layer, depositing a capping layer on the metal silicide layer.

8. The method according to claim 7, wherein the step of depositing the capping layer is implemented in situ with respect to the step of depositing the metal silicide layer.

9. The method according to claim 7, wherein the capping layer comprises a Ti layer or a TiN layer.

10. The method according to claim 1, wherein annealing is conducted at a temperature in the range of 700~850 C.

11. A method for manufacturing a semiconductor device, comprising the steps of:
    forming a gate and a junction region on a semiconductor substrate;
    forming an insulation layer on the semiconductor substrate;
    etching the insulation layer to define a contact hole exposing the junction region;
    depositing a metal silicide layer on a surface of the contact hole and the insulation layer, the metal silicide layer having a concentration gradient that changes from a silicon-rich composition to a metal-rich composition, wherein a lower portion of the metal silicide layer has the silicon-rich composition and an upper portion of the metal silicide layer has the metal-rich composition; and
    annealing the metal silicide layer such that compositions of metal and silicon in the metal silicide layer become uniform.

12. The method according to claim 11, further comprising the step of:
    after forming the insulation layer having the contact hole and before depositing the metal silicide layer, cleaning the resultant semiconductor substrate including a bottom of the contact hole.

13. The method according to claim 11, wherein the metal silicide layer is deposited through a CVD process.

14. The method according to claim 11, wherein the metal silicide layer comprises a $CoSi_x$ layer.

15. The method according to claim 11, wherein the metal to silicon composition ratio is in the range of 1:3~1:10 in the silicon-rich portion of the metal silicide layer.

16. The method according to claim 11, wherein the metal to silicon composition ratio is in the range of 1:0.1~1:0.9 in the metal-rich portion of the metal silicide layer.

17. The method according to claim 11, further comprising the step of:

after depositing the metal silicide layer and before annealing the metal silicide layer, depositing a capping payer on the metal silicide layer.

18. The method according to claim 17, wherein the step of depositing the capping layer is implemented in situ with respect to the step of depositing the metal silicide layer.

19. The method according to claim 17, wherein the capping layer comprises a Ti layer or a TiN layer.

20. The method according to claim 11, wherein annealing is conducted at a temperature in the range of 700~850° C.

* * * * *